United States Patent
Lee et al.

(10) Patent No.: US 11,409,400 B2
(45) Date of Patent: Aug. 9, 2022

(54) TOUCH DISPLAY DEVICE

(71) Applicant: LG Display Co., Ltd., Seoul (KR)

(72) Inventors: Keongjin Lee, Seoul (KR); Byungjoo Lee, Seoul (KR); Juhoon Jang, Paju-si (KR); Ara Yoon, Seoul (KR); Woonchan Moon, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/121,275

(22) Filed: Dec. 14, 2020

(65) Prior Publication Data

US 2021/0200382 A1 Jul. 1, 2021

(30) Foreign Application Priority Data

Dec. 30, 2019 (KR) ........................ 10-2019-0178071

(51) Int. Cl.
  *G06F 3/044* (2006.01)
  *G02B 1/14* (2015.01)
  *G02B 3/00* (2006.01)
  *H01L 27/32* (2006.01)

(52) U.S. Cl.
  CPC ............. *G06F 3/0446* (2019.05); *G02B 1/14* (2015.01); *G02B 3/0056* (2013.01); *G06F 2203/04112* (2013.01); *H01L 27/323* (2013.01)

(58) Field of Classification Search
  None
  See application file for complete search history.

(56) References Cited

U.S. PATENT DOCUMENTS

| | | |
|---|---|---|
| 8,901,587 B2 | 12/2014 | Ohta |
| 8,963,138 B2 | 2/2015 | Lim et al. |
| 10,033,014 B2 | 7/2018 | Chen et al. |
| 10,224,377 B2 | 3/2019 | Park et al. |
| 10,516,140 B2 | 12/2019 | Chen et al. |
| 10,522,791 B2 | 12/2019 | Chen et al. |
| 10,553,827 B2 | 2/2020 | Jang et al. |
| 10,739,889 B2 | 8/2020 | Hwang et al. |
| 10,817,090 B2 | 10/2020 | Gwon et al. |
| 2010/0327304 A1 | 12/2010 | Sonoda et al. |
| 2011/0057221 A1 | 3/2011 | Sonoda |
| 2019/0165053 A1* | 5/2019 | Park ................ H01L 27/3211 |
| 2019/0179466 A1 | 6/2019 | Kim et al. |
| 2019/0221779 A1 | 7/2019 | Jang et al. |
| 2021/0004108 A1 | 1/2021 | Gwon et al. |

FOREIGN PATENT DOCUMENTS

| | | |
|---|---|---|
| KR | 10-2016-0029087 A | 3/2016 |
| KR | 10-2019-0003181 A | 1/2019 |
| KR | 10-2019-0047554 A | 5/2019 |
| KR | 10-2019-0069240 A | 6/2019 |
| KR | 10-2019-0078989 A | 7/2019 |
| KR | 10-2019-0086605 A | 7/2019 |

* cited by examiner

*Primary Examiner* — Duane N Taylor, Jr.
(74) *Attorney, Agent, or Firm* — Birch, Stewart, Kolasch & Birch, LLP

(57) ABSTRACT

A touch display device includes a base substrate having a display area and a non-display area, a plurality of light emitting elements disposed in the display area, an encapsulation layer dispose to cover the plurality of light emitting elements, a plurality of touch electrodes having a mesh shape and disposed on the encapsulation layer, and a plurality of lens layers having a convex shape and disposed inside the touch electrode while being disposed on the encapsulation layer.

21 Claims, 9 Drawing Sheets

TOUCH DISPLAY DEVICE

CROSS-REFERENCE TO RELATED APPLICATION

This application claims priority to and the benefit of Korean Patent Application No. 10-2019-0178071, filed in the Republic of Korea on Dec. 30, 2019, the entire contents of which are hereby expressly incorporated by reference into the present application.

BACKGROUND

1. Field

The present disclosure relates to a touch display device ensuring improved luminance efficiency.

2. Background

With advances in technologies for display devices, various types of display devices such as a liquid crystal display (LCD) device, an organic light emitting display (OLED) device and the like have been developed.

As smart phones have become ubiquitous in recent years, display devices such as a touch display device, to which a new input method is applied, have been widely distributed.

The touch display devices denote a device that can perform not only a function of displaying a moving image or an image but also a touch-based input function such that a touch display device is operated by a touch of a user's finger or a pen.

SUMMARY

Since a touch display device provided with a new input means performs a key function of displaying a moving image or an image like a display device, improved luminance efficiency of the touch display device can result in improved performance of the touch display device.

As smart phones are frequently used in outdoor space thanks to its mobility, improved luminance efficiency is one of key factors of a touch display device to enhance visibility in outdoor space.

However, in case an additional process such as the mask process is added to improve luminance efficiency of the touch display device, a trade-off can be made between luminance efficiency and processing efficiency.

As a means to solve or address the above-described problems, Applicant of the present disclosure has devised a touch display device that can ensure improved luminance efficiency without deteriorating processing efficiency.

Accordingly, the present disclosure is directed to a touch display device comprising a lens layer that can improve luminance efficiency on the basis of improvement in light concentration efficiency and light output efficiency.

The present disclosure is also directed to a touch display device comprising a lens layer that can improve luminance efficiency without an additional mask process.

The present disclosure is also directed to a touch display device that can prevent damage done to a light emitting element in formation of a lens layer.

Aspects of the present disclosure are not limited to the above-described ones. Additionally, other aspects and advantages that have not been mentioned can be clearly understood from the following description and can be more clearly understood from the following embodiments. Further, it will be understood that the aspects and advantages of the present disclosure can be realized via means and combinations thereof that are described in the appended claims.

According to an aspect of an embodiment, a touch display device can ensure improved luminance efficiency without causing deterioration of processing efficiency.

According to an aspect of an embodiment, a touch display device can comprise a base substrate comprising a display area and a non-display area, a plurality of light emitting elements disposed in the display area, an encapsulation layer disposed to cover the plurality of light emitting elements, and a touch sensing layer comprising a plurality of touch electrodes and a plurality of lens layers, disposed on the encapsulation layer, wherein the plurality of touch electrodes have a mesh shape, and the plurality of lens layers have a convex shape and are disposed inside one touch electrode of the plurality of touch electrodes.

The touch display device can further comprise a bank layer disposed below the encapsulation layer and having a plurality of openings, and the touch electrode can be disposed to correspond to the bank layer.

In this case, a light emitting area of each of the light emitting elements can correspond to one or more lens layers.

The lens layer can comprise polytriazine that can be processed at low temperature, or a material where one or more of titanium dioxide ($TiO_2$), zirconium dioxide ($ZrO_2$) and a nano filler is added to polytriazine.

The touch display device can further comprise a lens protecting layer disposed to cover the lens layer, a polarizing layer can be disposed on the lens protecting layer, and a refractive index of the lens protecting layer can be lower than a refractive index of the lens layer.

In this case, the touch display device can further comprise a second dam disposed in the non-display area and configured to surround the lens protecting layer.

The touch display device can further comprise an adhesive layer disposed to cover the lens layer, a polarizing layer can be disposed on the adhesive layer, and a refractive index of the adhesive layer can be lower than a refractive index of the lens layer.

According to the present disclosure, a lens layer corresponding to a light emitting area of a light emitting element can be disposed over an encapsulation layer having a predetermined thickness such that the light emitting element is spaced a predetermined distance apart from the lens layer, thereby ensuring a focal length of a lens to improve concentration efficiency and output efficiency of light emitted from the light emitting element and ensuring improved luminance efficiency.

According to an aspect of an embodiment, when a lens protecting layer having a refractive index lower than that of the lens layer can be formed to cover the lens layer, light concentration efficiency and light output efficiency can be further improved thanks to a difference between the refractive index of the lens layer and the refractive index of the lens protecting layer.

According to an aspect of another embodiment, when a polarizing layer comprising an adhesive layer having a refractive index lower than that of the lens layer can be formed to overlay the lens layer, light concentration efficiency and light output efficiency can be further improved thanks to a difference between the refractive index of the lens layer and the refractive index of the adhesive layer.

Unlike a process of the related art, a process according to the present disclosure can comprise a lens layer that can be formed without an additional mask process, thereby causing no deterioration of processing efficiency and ensuring improved luminance efficiency.

According to the present disclosure, the lens layer can comprise a material that can be formed in lower-temperature processing carried out at a temperature of 100 degrees Celsius or lower, thereby minimizing damage, which is caused due to high temperature and done to a light emitting element below the lens layer, in a process of forming the lens layer.

Detailed effects of the present disclosure are described together with the above-described effects in the detailed description of the disclosure.

BRIEF DESCRIPTION OF THE DRAWINGS

The accompanying drawings constitute a part of this specification, illustrate one or more embodiments of the present disclosure, and together with the specification, explain the present disclosure, wherein.

DETAILED DESCRIPTION OF THE EMBODIMENTS

Figure 1:
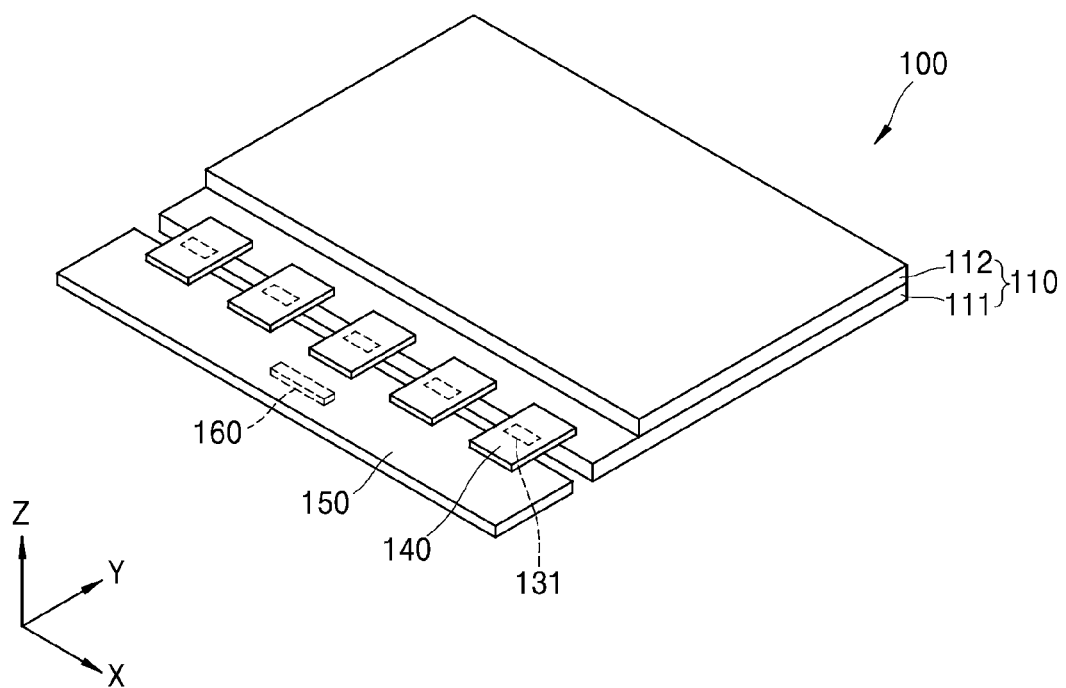
FIG. 1 is a perspective view illustrating a touch display device according to an aspect of an embodiment.

The above-described aspects, features and advantages are specifically described with reference to the accompanying drawings hereunder such that one having ordinary skill in the art to which the present disclosure pertains can easily implement the technical spirit of the disclosure. During description in the disclosure, detailed description of known technologies in relation to the disclosure is omitted if it is deemed to make the gist of the present disclosure unnecessarily vague. Below, preferred embodiments according to the disclosure are described with reference to the accompanying drawings. Throughout the drawings, identical reference numerals denote identical or similar components.

When any component is described as being "at an upper portion (or a lower portion) of a component" or "on (or under)" a component, any component can be placed on the upper surface (or the lower surface) of the component, and an additional component can be interposed between the component and any component placed on (or under) the component.

In describing the components of the disclosure, when any one component is described as being "connected," "coupled" or "connected" to another component, the component can be directly connected or can be able to be directly connected to another component; however, it is also to be understood that an additional component can be "interposed" between the two components, or the two components can be "connected", "coupled" or "connected" through an additional component.

Below, a touch display device according to aspects of some embodiments is described. All components of the touch display device according to all embodiments of the present disclosure are operatively coupled and configured.

Figure 2:
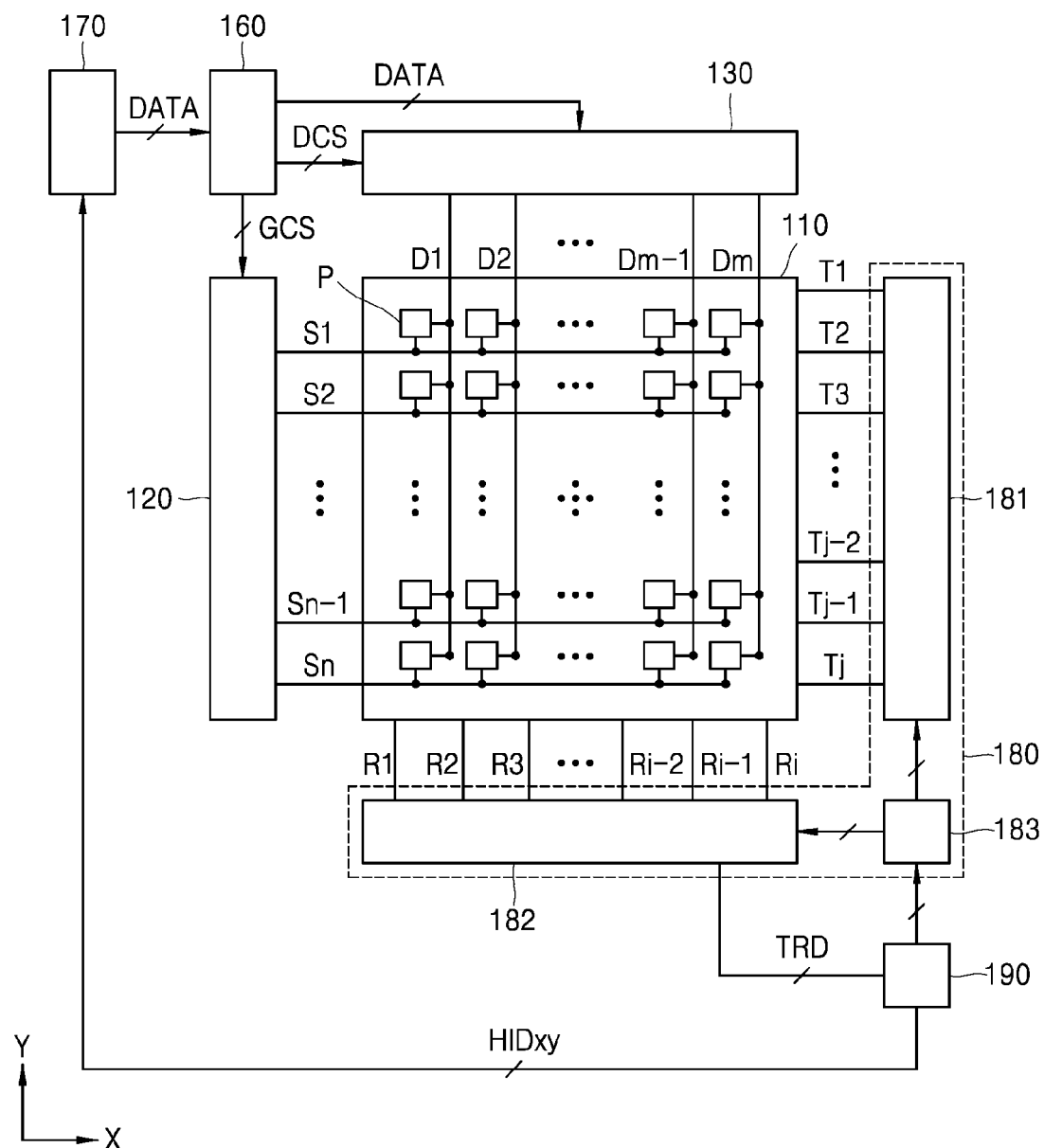
FIG. 2 is a block diagram illustrating a touch display device according to an aspect of an embodiment.

Referring to FIGS. 1 and 2, a touch display device 100 according to an aspect of an embodiment can comprise a display panel 110, a scan diver 120, a data driver 130, a timing controller 150, a host system 170 and a touch driver 180 and a touch coordinate generator 190.

In the disclosure, a touch display device implemented as an organic light emitting display (OLED) device is provided as an example but is not limited to this example. The touch display device can be implemented as various types of flat panel display devices such as a liquid crystal display (LCD) device and the like.

The display panel 110 can comprise a display area that is an area provided with a plurality of pixels (P) and displaying an image. Data lines (D1 to Dm; m denotes 2 or greater positive integers) and scan lines (S1 to Sn; n denotes 2 or greater positive integers) can be formed on the display panel 110. The data lines (D1 to Dm) can be configured to cross the scan lines (S1 to Sn). The scan lines can be gate lines. The pixels (P) can be formed in an area defined by a structure where the scan lines and the data lines cross.

The pixels (P) of the display panel 110 can respectively connect to any one of the data lines (D1 to Dm) and any one of the scan lines (S1 to Sn).

Each of the pixels (P) of the display panel 110 can comprise a driving transistor configured to adjust electric current between drain-sources on the basis of a data voltage supplied to a gate electrode, a scan transistor configured to be turned on according to a scan signal of the scan line and to supply a data voltage of the data line to a gate electrode of a driving transistor, an organic light emitting diode configured to emit light on the basis of electric current between drain-sources of the driving transistor, and a capacitor for storing a voltage of a gate electrode of the driving transistor. Accordingly, each of the pixels (P) can emit light on the basis of electric current supplied to the organic light emitting diode.

The scan driver 120 can receive a scan control signal (GCS) from the timing controller 160. The scan driver 120 can supply scan signals to the san lines (S1 to Sn) according to the scan control signal (GCS).

The scan driver 120 can be formed in a non-display area at one side or both sides of a display area of the display panel 110 according to the gate driver in panel (GIP) method. Alternatively, the scan driver 120 can be manufactured as a driving chip, can be mounted onto a flexible film and can be attached to a non-display area at one side or both sides of the display area of the display panel 110 according to the tape automated bonding (TAB) method.

The data driver 130 can receive digital video data (DATA) and a data control signal (DCS) from the timing controller 160. The data driver 130 can convert the digital video data (DATA) into an analogue positive polarity/negative polarity data voltage according to the data control signal (DCS) and can supply the converted digital video data (DATA) to the data lines. For example, pixels to which data voltages are supplied can be selected according to the scan signals of the scan driver 120, and the data voltages can be supplied to the selected pixels.

The data driver 130, as in FIG. 1 can comprise a plurality of source drive ICs 131. Each of the plurality of source drive ICs 131 can be mounted onto a flexible film 140 according to the chip on film (COF) method or the chip on plastic (COP) method. The flexible film 140 can be attached onto pads in the non-display area of the display panel 110 using an anisotropic conducting film. Accordingly, the plurality of source drive ICs 131 can connect to the pads.

A circuit board 150 can be attached to the flexible films 140. A plurality of circuits implemented as driving chips can be mounted onto the circuit board 150. For example, the timing controller 160 can be mounted onto the circuit board 150. The circuit board 150 can be a printed circuit board or a flexible printed circuit board.

The timing controller 160 can receive digital video data (DATA) and timing signals from the host system 170. The timing signals can comprise a vertical synchronization signal, a horizontal synchronization signal, a data enable signal, a dot clock and the like. The vertical synchronization signal is a signal that defines 1 frame period. The horizontal synchronization signal is a signal that defines 1 horizontal period required for supplying data voltages to pixels of 1 horizontal line of the display panel (DIS). The data enable signal is a signal that defines a period during which effective data are input. The dot clock is a signal that is repeated on the basis of a predetermined short cycle.

The timing controller 160 can generate a data control signal (DCS) for controlling an operation timing of the data driver 130 and a scan control signal (GCS) for controlling an operation timing of the scan driver 120 according to timing signals to control an operation timing of the scan driver 120 and the data driver 130. The timing controller 160 can output a scan control signal (GCS) to the scan driver 120 and can output digital video data (DATA) and a data control signal (DCS) to the data driver 130.

The host system 170 can be implemented as a navigation system, a set top box, a DVD player, a blue ray player, a personal computer (PC), a home theater system, a broadcast receiver, a phone system and the like. The host system 170 can comprise a system on chip (SoC) into which a scaler is built, and can convert digital video data (DATA) of an input image into a format appropriate to be displayed on the display panel 110. The host system 170 can transmit the digital video data (DATA) and timing signals to the timing controller 160.

In addition to the data lines (D1 to Dm) and the scan lines (S1 to Sn), first and second touch electrodes can be formed at the display panel 110. The first touch electrodes can be configured to cross the second touch electrodes. The first touch electrodes can connect to a first touch driver 181 through first touch lines (T1 to Tj; j denotes 2 or greater positive integers). The second touch electrodes can connect to a second touch driver 182 through second touch lines (R1 to Ri; i denotes 2 or greater positive integers). A touch sensor can be formed in each of the portions where the first touch electrodes and the second touch electrodes are crossed. In the embodiments of the present disclosure, the touch sensor is implemented as a mutual capacitance but not be limited.

The touch driver 180 can supply a driving pulse to the first touch electrodes through the first touch lines (T1 to Tj) and can sense a change in amounts of charge of each of the touch sensors through the second touch lines (R1 to Ri). Referring to FIG. 2, the first touch lines (T1 to Tj), which are Tx lines for supplying a driving pulse, and the second touch lines (R1 to Ri), which are Rx lines for sensing a change in amounts of charge of each of the touch sensors, are provided as examples.

The touch driver 180 can comprise a first touch driver 181, a second touch driver 182 and a touch controller 183. The first touch driver 181, the second touch driver 182, and the touch controller 183 can be integrated in a single readout integrated circuit (ROIC).

The first touch driver 181 can select a first touch line to which a driving pulse is output under the control of the touch controller 183, and can supply a driving pulse to the selected first touch line. For example, the first touch driver 181 can supply driving pulses consecutively to the first touch lines (T1 to Tj).

The second touch driver 182 can select second touch lines that receive changes in amounts of charge of the touch sensors under the control of the touch controller 183, and can receive the changes in amounts of charge of the touch sensors through the selected second touch lines. The second touch driver 182 can sample the changes in amounts of charge of the touch sensors, received through the second touch lines (R1 to Ri), and can convert the same into touch raw data (TRD) that are digital data.

The touch controller 183 can generate a Tx setup signal for setting a first touch line to which a driving pulse is output in the first touch driver 181, and an Rx setup signal for setting a second touch line that receives a touch sensor voltage in the second touch driver 182. The touch controller 183 can also generate timing control signals for controlling operation timings of the first touch driver 181 and the second touch driver 182.

The touch coordinate generator 190 can receive the touch row data (TRD) from the touch driver 180. The touch coordinate generator 190 can generate touch coordinate(s) according to a method of generating a touch coordinate, and can output touch coordinate data (HIDxy) including information on the touch coordinate(s) to the host system 170.

The touch coordinate generator 190 can be implemented as a micro controller unit (MCU). The host system 170 can analyze the touch coordinate data (HIDxy) input from the touch coordinate generator 190 and can execute an application program associated with a coordinate of a user's touch. The host system 170 can transmit digital video data (DATA) and timing signals to the timing controller 160 on the basis of the executed application program.

The touch driver 180 can be included in source drive ICs 131 or can be manufacture as an additional driving chip and mounted onto the circuit board 150. The touch coordinate generator 190 can be manufactured as a diving chip and mounted onto the circuit board 150.

The display panel 110 can comprise a first substrate 111 and a second substrate 112, and a thin film transistor layer, a light emitting element layer, an encapsulation layer and a touch sensing layer that are disposed between the first and second substrates 111, 112.

The first substrate 111 can be a substrate made of a plastic film or glass.

The thin film transistor layer can be formed on the first substrate 111. The thin film transistor layer can comprise scan lines, data lines and thin film transistors. Each of the thin film transistors can comprise a gate electrode, a semiconductor layer, a source electrode and drain electrodes. In case the scan driver is formed according to the gate driver in panel (GIP) method, the scan driver can be formed along with the thin film transistor.

The light emitting element layer can be formed on the thin film transistor. In the present disclosure, an organic light emitting element layer, which uses a light emitting element as an organic light emitting element, is provided as an example of the light emitting element layer but is not limited to this example. The organic light emitting element layer can comprise a first electrode, an organic light emitting layer, a second electrode and banks.

Each of the organic light emitting layers can comprise a hole transporting layer, a light emitting layer (an organic light emitting layer) and an electron transporting layer. In this case, when a voltage is supplied to the first electrode and the second electrode, a hole and an electron can move to the light emitting layer respectively through the hole transporting layer and the electron transporting layer, can be coupled to each other in the light emitting layer and can emit light. Pixels can be provided in an area where the organic light emitting element layer is formed. Accordingly, the area where the organic light emitting element layer is formed can be defined as a display area. An area around the display area can be defined as a non-display area.

The encapsulation layer can be formed on the organic lighting emitting element layer. The encapsulation layer can prevent air or moisture from infiltrating into the organic light emitting element layer. The encapsulation layer can comprise at least one organic encapsulation film.

A touch sensing layer can be formed on the encapsulation layer. The touch sensing layer can comprise first touch electrodes and second touch electrodes for sensing a user's touch, and can also comprise bridge electrodes for electrically connecting the first touch electrodes or electrically connecting the second touch electrodes.

Below, a touch display device according to an aspect of an embodiment is described with reference to FIGS. 3 to 6.

Referring to FIGS. 3 to 6, a first substrate 111 can be referred to as a base substrate and can comprise a display area (DA) and a non-display area (NDA).

The first substrate 111, as described above, can be made of a glass-based material but not be limited. In case the first substrate 111 is applied to a flexible touch display device, a plastic substrate such as a polyimide-based substrate having flexibility can be used as the first substrate 111.

A pad area (PA) where pads are formed and a dam (DAM) can be included in the non-display area (NDA.

In this case, a plurality of dams (DAM) can be formed, and a dam can be formed respectively in different layers.

Figure 3:
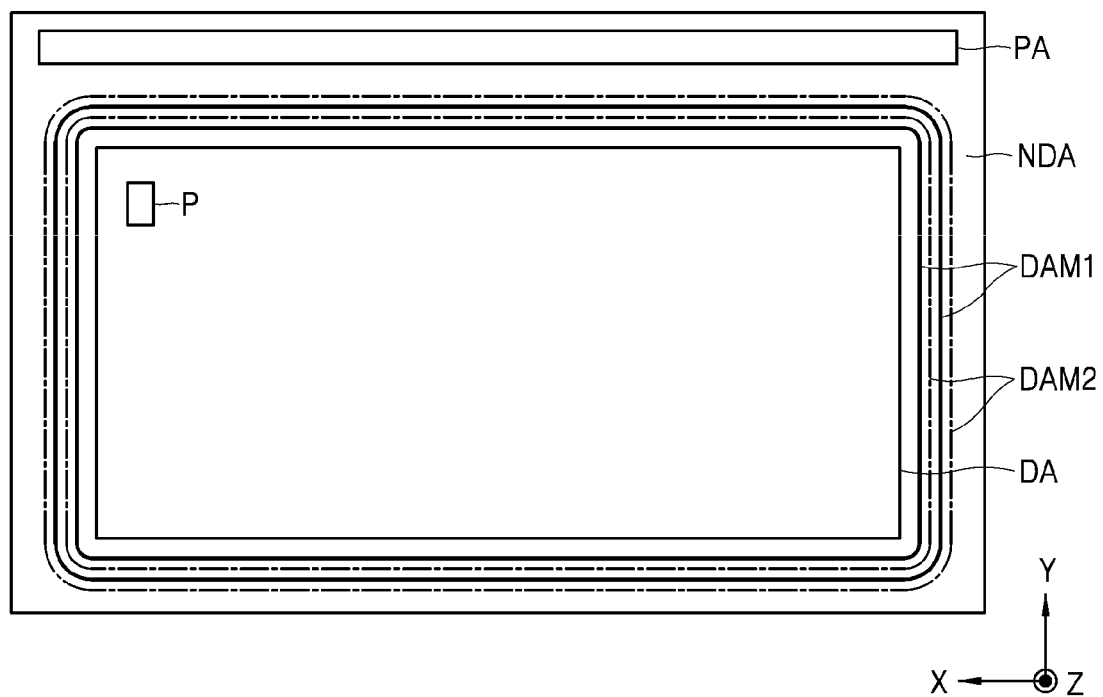
FIG. 3 is a plan view schematically illustrating a first substrate according to an aspect of an embodiment.

FIG. 3 illustrates an embodiment where two couples of dams (DAM) respectively disposed in different layers. In the drawing, a plurality of first dams (DAM1) and a plurality of second dams (DAM2) are disposed to overlap mutually in an up-down direction but are not limited to this example. The plurality of second dams (DAM2) can be disposed between the display area (DA) and the plurality of first dams (DAM1), or the plurality of first dams (DAM1) can be disposed between the display area (DA) and the plurality of second dams (DAM2).

A thin film transistor layer and an organic light emitting element layer can be formed in the display area (DA) of the first substrate 111.

The thin film transistor layer can comprise thin film transistors 210, a gate insulation layer 220, an interlayer insulation layer 230, a protecting layer 240 and a planarizing layer 250.

A buffer layer can be formed on one surface of the first substrate 111. The buffer layer can be formed on one surface of the first substrate 111 to protect the thin film transistors 210 and the organic light emitting elements 260 from moisture infiltrating through the first substrate 111 vulnerable to infiltration of moisture. One surface of the first substrate 111 can be a surface that faces the second substrate 112.

The buffer layer can be formed into a plurality of inorganic layers that are alternately stacked. For example, the buffer layer can be formed into a multiple layer in which one or more inorganic films of a silicon oxide film (SiOx), a silicon nitride film (SiNx) and SiON are alternately stacked.

The thin film transistor 210 can be formed on the buffer layer. The thin film transistor 210 can comprise an active layer 211, a gate electrode 212, a source electrode 213 and a drain electrode 214. In the present disclosure, the thin film transistor 210 formed according to the top gate method by which the gate electrode 212 is disposed at an upper portion of the active layer 211 is described as an example but is not limited to this example. The thin film transistor 210 can be formed according to the bottom gate method or the double gate method.

The active layer 211 can be formed on the buffer layer. The active layer 211 can be made of an oxide semiconductor material such as an indium gallium zinc oxide (IGZO) but not be limited. The active layer 211 can also be made of low temperature polycrystalline silicon (LTPS) or amorphous silicon (a-Si).

A light blocking layer can be formed between the buffer layer and the active layer 211 to block external light incident to the active layer 211.

The gate insulation layer 220, which can insulate the active layer 211 from the gate electrode 212, can be formed on the active layer 211. The gate insulation layer 220 can be formed into an inorganic layer e.g., a silicon oxide film (SiOx), a silicon nitride film (SiNx) or a multiple layer thereof.

The gate electrode 212 and the gate line can be formed on the gate insulation layer 220. The gate electrode 212 and the gate line can be formed into a single layer or a multi layer comprising any one of molybdenum (Mo), aluminum (Al), chromium (Cr), gold (Au), titanium (Ti), nickel (Ni), neodymium (Nd) and copper (Cu) or an alloy thereof.

The interlayer insulation layer 230 can be formed on the gate electrode 212 and the gate line. The interlayer insulation layer 230 can be formed into an inorganic film, e.g., a silicon oxide film (SiOx), a silicon nitride film (SiNx) or a multiple layer thereof.

A source electrode 213, a drain electrode 214 and a data line can be formed on the interlayer insulation layer 230. The source electrode 213 and the drain electrode 214 can respectively connect to the active layer 211 through a contact hole that passes through the gate insulation layer 220 and the interlayer insulation layer 230. The source electrode 213, the drain electrode 214 and the data line can be formed into a single layer or a multi layer comprising any one of molybdenum (Mo), aluminum (Al), chromium (Cr), gold (Au), titanium (Ti), nickel (Ni), neodymium (Nd) and copper (Cu) or an alloy thereof.

The protecting layer 240 for insulating the thin film transistor 210 can be formed on the source electrode 213, the drain electrode 214 and the data line. The protecting layer 240 can be formed into an inorganic film, e.g., a silicon oxide film (SiOx), a silicon nitride film (SiNx) or a multiple layer thereof.

The planarizing layer 250 for planarizing a step created by the thin film transistor 210 can be formed on the protecting layer 240. The planarizing layer 250 can be formed into an organic film of an acryl resin, an epoxy resin, a phenolic resin, a polyamide resin, a polyimide resin and the like.

An organic light emitting element layer can be formed over the thin film transistor layer. The organic light emitting element layer can comprise organic light emitting elements 260 and bank layers 270.

For example, a plurality of light emitting elements can be disposed in the display area. In the present disclosure, an organic light emitting element is described as an example of the light emitting element but is not limited to this example.

The organic light emitting element 260 and the bank layer 270 can be formed on the planarizing layer 250. The organic light emitting element can comprise a first electrode 261, an organic light emitting layer 262 and a second electrode 263. The first electrode 261 can be an anode electrode and the second electrode 263 can be a cathode electrode.

The first electrode 261 can be formed on the planarizing layer 250. The first electrode 261 can connect to a source electrode 223 of the thin film transistor 210 through a contact hole that passes through the protecting layer 240 and the planarizing layer 250. The first electrode 261 can be made of a metallic material having high reflectivity such as a structure (Ti/Al/Ti) where aluminum and titanium are stacked, a structure (ITO/Al/ITO) where aluminum and ITO are stacked, an APC alloy, and a structure (ITO/APC/ITO) where an APC alloy and ITO are stacked. The APC alloy is an alloy of silver (Ag), palladium (Pd) and copper (Cu).

The bank layer 270 can be configured to cover an edge of the first electrode 261 on the planarizing layer 250 to separate pixels (P). For example, the bank layer 270 can serve as a pixel defining layer that defines pixels (P). Specifically, the bank layer 270 is disposed to have a plurality of openings (OA) and the opening (OA) can correspond to light emitting areas (EA) of the organic light emitting elements 260.

The bank layer 270 can be formed into an organic film of an acryl resin, an epoxy resin, a phenolic resin, a polyamide resin, a polyimide resin and the like.

The organic light emitting layer 262 can be formed on the first electrode 261 and the bank layer 270. The organic light emitting layer 262 can comprise a hole transporting layer, at least one light emitting layer and an electron transporting layer. In this case, when a voltage is supplied to the first electrode 261 and the second electrode 263, a hole and an electron can move to the light emitting layer respectively through the hole transporting layer and the electron transporting layer, and can be mutually coupled in the light emitting layer and can emit light.

The organic light emitting layer 262 can be formed into a white light emitting layer that emits white light. In this case, the organic light emitting layer 262 can be configured to partially overlap the first electrode 261 and the bank layer 270. In this case, a color filter can be further formed over the organic light emitting layer 262.

The organic light emitting layer 262 can comprise a red light emitting layer that emits red light, a green light emitting layer that emits green light, or a blue light emitting layer that emits blue light. In this case, the organic light emitting layer 262 can be formed in an area corresponding to the first electrode 261, and may not be further provided with an additional color filter.

The second electrode 263 can be formed on the organic light emitting layer 262. In case an organic light emitting display device is formed into a top emission structure, the second electrode 263 can be made of a transparent conductive material (TCO) such as ITO and IZO that can transmit light or can be made of a semi-transmissive conductive material such as magnesium (Mg), silver (Ag) or an alloy of magnesium (Mg) and silver (Ag).

An encapsulation layer 280 configured to cover a plurality of light emitting elements can be formed over the organic light emitting element layer from the display area (DA) to the non-display area (NDA) of the first substrate 111.

The encapsulation layer 280 can prevent air or moisture from infiltrating into the organic light emitting layer 262 and the second electrode 263. To this end, the encapsulation layer 280 can comprise at least one inorganic film and at least one organic film. For example, the encapsulation layer 280 can comprise a first inorganic encapsulation film 281, an organic encapsulation film 282 and a second inorganic encapsulation film 283.

The first inorganic encapsulation film 281 can be disposed on the second electrode 263. The first inorganic encapsulation film 281 can be configured to cover the second electrode 263. The organic encapsulation film 282 can be disposed on the first inorganic encapsulation film 281. The organic encapsulation film 282 can be thick enough to prevent particles from passing through the first inorganic encapsulation film 281 and infiltrating into the organic light emitting layer 262 and the second electrode 263. The second inorganic encapsulation film 283 can be disposed on the organic encapsulation film 282. The second inorganic encapsulation film 283 can be configured to cover the organic encapsulation film 282.

The first and second inorganic films 281, 283 can be respectively made of a silicon nitride, an aluminum nitride, a zirconium nitride, a titanium nitride, a hafnium nitride, a tantalum nitride, a silicon oxide, an aluminum oxide, or a titanium oxide.

The organic encapsulation film 282 can comprise an acryl resin or an epoxy resin and can have a predetermined thickness to ensure a lens focal length between the light emitting element and a below-described lens layer.

The encapsulation layer 280 can comprise a closed curve-shaped first dam (DAM1) that is disposed in the non-display area (NDA) to surround the organic encapsulation film 282. Accordingly, a flow of the organic encapsulation film 282 that is highly flowable can be prevented. For example, the first dam (DAM1) can be configured to surround an outer edge of the display area (DA) and to block a flow of the organic encapsulation film 282 that constitutes the encapsulation layer 280.

Accordingly, the first dam (DAM1) can be disposed between the display area (DA) and the pad area (PA) and can block a flow of the organic encapsulation film 282 such that the organic encapsulation film 282, constituting the encapsulation layer 280, is prevented from invading into the pad area (PA). Accordingly, the first dam (DAM1) can block the organic encapsulation film 282 from being exposed outside the display device or invading into the pad area (PA).

Figure 5:
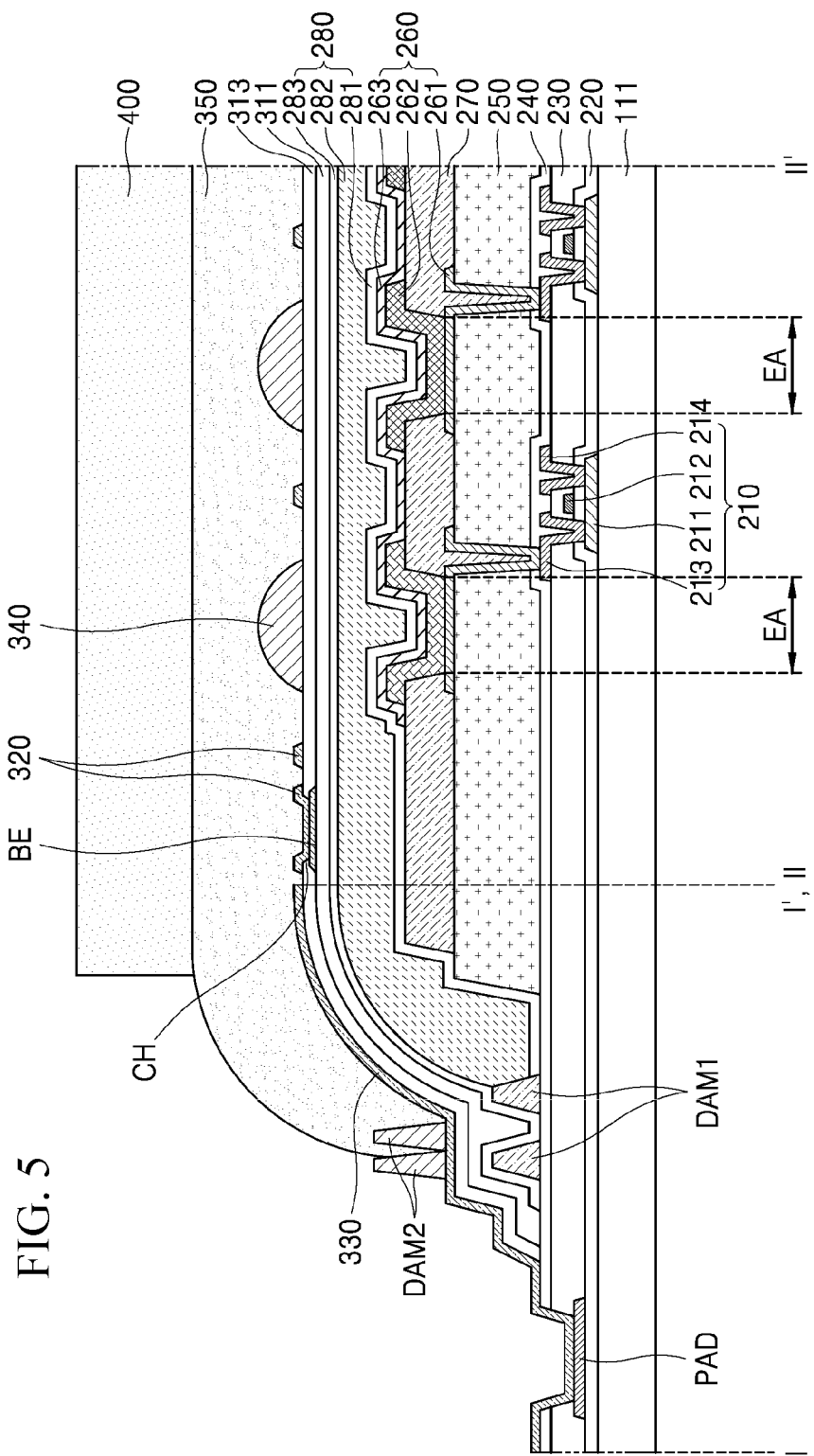
FIG. 5 is a cross-sectional view illustrating an example of section I-I' and section II-II' in FIG. 4.

The first dam (DAM1) can be formed into a single dam. In case a plurality of first dams (DAM1) is formed, a flow of the organic encapsulation film 282 can be blocked more effectively. In FIG. 5 of the present disclosure, two first dams (DAM1) are illustrated but are not limited to this example.

The first dam (DAM1) can be formed at the same time as the planarizing layer 250 or the bank layer 270 of the pixel (P) are formed, and can be made of the same material as the planarizing layer 250 or the bank layer 270.

A touch sensing layer can be formed on the encapsulation layer 280. The touch sensing layer can comprise touch electrodes 320 including first touch electrodes (TE) and second touch electrodes (RE), bridge electrodes (BE), a lens layer 340, a touch buffer layer 311 and an insulation layer 313.

The touch buffer layer 311 can be formed on the encapsulation layer 280, and a pad (PAD) can be configured to be exposed in the display area (DA) and the non-display area (NDA). The touch buffer layer 311 can be configured to overlay the first dam (DAM1) under the encapsulation layer 280.

The touch buffer layer 311 can prevent a liquid chemical such as a develop or an etchant, which is used to manufacture touch electrodes formed on the touch buffer layer 311, or a particle such as external moisture and the like from infiltrating into the light emitting element including an organic material.

The bridge electrodes (BE) can be formed on the touch buffer layer 311. The bridge electrodes (BE) can be formed in the display area (DA), and can electrically connect the first touch electrodes (TE) formed on the insulation layer 313.

Figure 4:
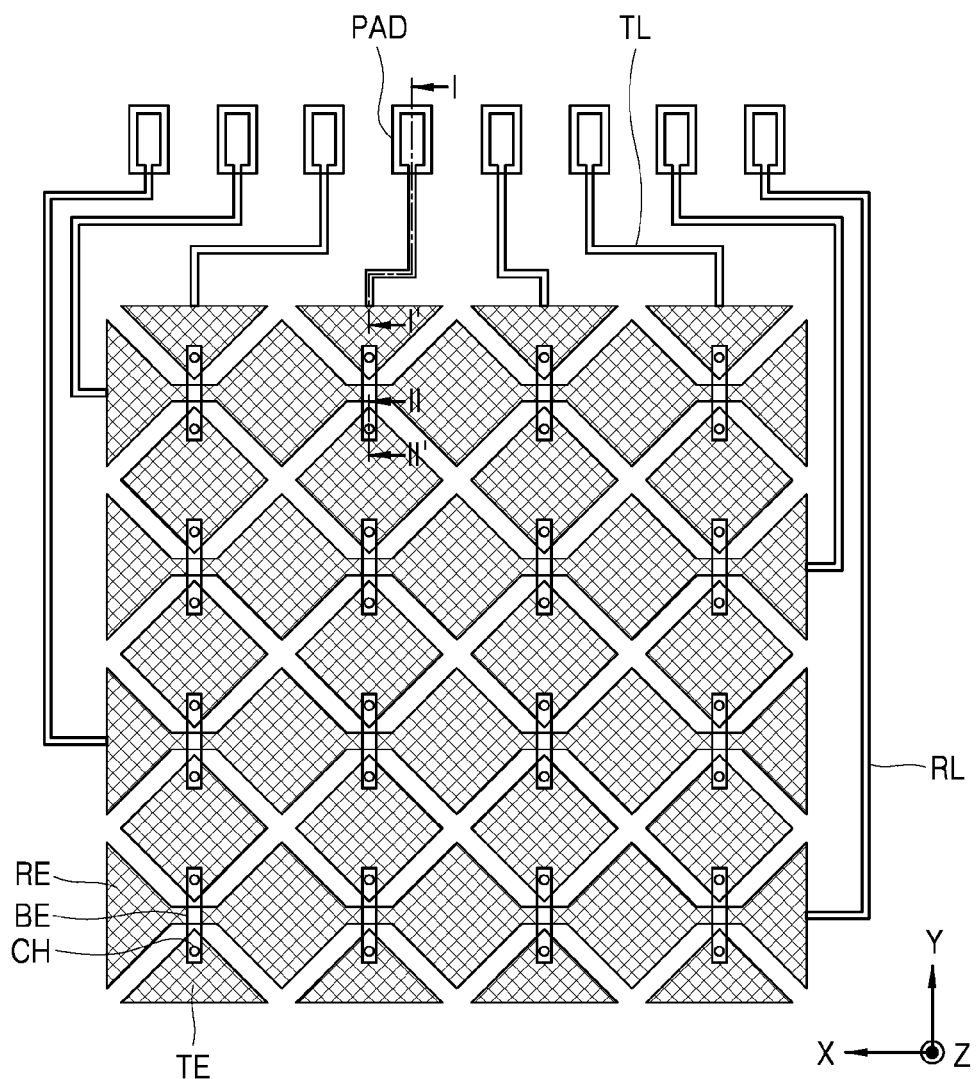
FIG. 4 is a plan view illustrating an example of a touch sensing layer disposed on a first substrate according to an aspect of an embodiment.

To prevent a mutual short circuit of the first touch electrodes (TE) and the second touch electrodes (RE) in an area where the first touch electrodes (TE) and the second touch electrodes (RE) are crossed, first touch electrodes (TE) adjacent to each other in a first direction (the y-axis direction) can be electrically connected through the bridge electrodes (BE), as in FIG. 4. The bridge electrode (BE) can be disposed in a layer different from those of the first and second touch electrodes (TE and RE), and can be connected to the first touch electrodes (TE) adjacent to each other through contact holes (CH). The bridge electrode (BE) and the second touch electrode (RE) can be crossed.

In this case, the contact holes (CH) can be configured to pass through the insulation layer 313. The bridge electrode (BE) can be disposed at a lower portion of the insulation layer 313 and can be exposed by two contact holes. As such, the bridge electrode (BE) can connect with two first touch electrodes (TE) adjacent to the bridge electrode (BE).

The insulation layer 310 can be formed over the touch buffer layer 311 to cover the bridge electrodes (BE), and can insulate the bridge electrodes (BE) from the second touch electrodes (RE). The insulation layer 313 can be disposed between the bridge electrodes (BE) to insulate the bridges electrodes (BE) from each other.

The insulation layer 313 can be configured to extend to the non-display area (NDA) as well as the display area (DA). The insulation layer 313 can be configured to overlay an area of the first dam (DAM1) and can reduce a height of a step caused by the first dam (DAM1).

Accordingly, a plurality of mesh-type touch electrodes 320 can be formed on the insulation layer 313 over the encapsulation layer 280. The touch electrode 320 can comprise first touch electrodes (TE) and second touch electrodes (RE).

The first touch electrodes (TE) and the second touch electrodes (RE) can be formed in the display area (DA). The first touch electrodes (TE) can be disposed in a first direction (the y-axis direction) and can connect to each other, and the second touch electrodes (RE) can be disposed in a second direction (the x-axis direction) and can connect to each other. The first direction (the y-axis direction) can be a direction in parallel with a direction of scan lines (S1 to Sn), and the second direction (the x-axis direction) can be a direction in parallel with a direction of data lines (D1 to Dm). Alternatively, the first direction (the y-axis direction) can be a direction in parallel with a direction of data lines (D1 to Dm), and the second direction (the x-axis direction) can be a direction in parallel with a direction of scan lines (S1 to Sn).

Each of the first touch electrodes (TE) connected in the first direction (the y-axis direction) can be electrically insulated from its adjacent first touch electrodes (TE) in the second direction (the x-axis direction). Each of the second touch electrodes (RE) connected in the second direction (the x-axis direction) can be electrically insulated from its adjacent second touch electrodes (RE) in the first direction (the y-axis direction).

As such, in an area where the first touch electrode (TE) and the second touch electrode (RE) cross, a mutual capacitance corresponding to a touch sensor can be formed.

Figure 6:
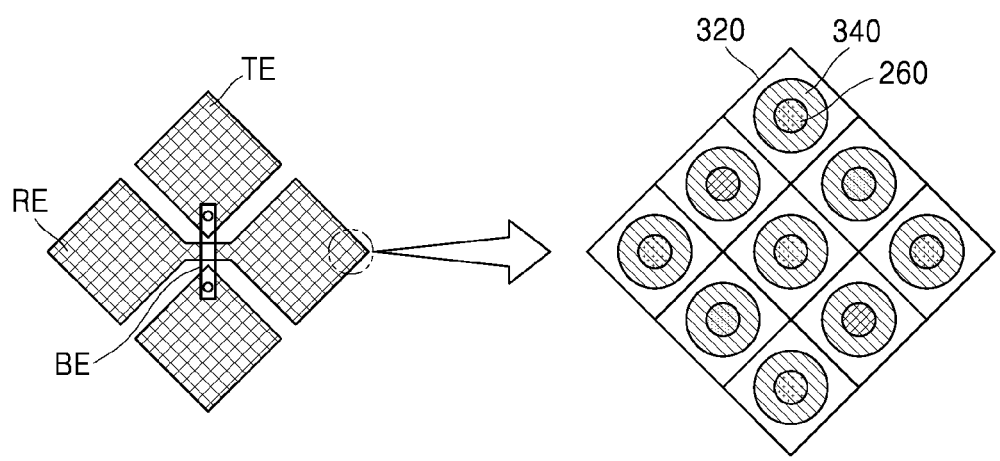
FIG. 6 is an enlarged plan view illustrating a touch electrode according to an aspect of an embodiment.

The touch electrode 320 can be patterned to have a mesh shape. The touch electrodes 320, as illustrated in FIG. 6, can be formed into a mesh shape to have a hollow opening.

As the touch electrode 320 is formed into a mesh shape, light emitting elements 260 below the touch electrode can correspond to the hollow opening of the touch electrode 320 and light output efficiency can be improved.

The touch electrode 320 can be disposed to correspond to the bank layer 270 therebelow. The bank layer 270, as described above, can be disposed to have a plurality of openings, and the openings can correspond to light emitting areas (EA) of the light emitting elements 260. Accordingly, the opening of the touch electrode 320 can also be disposed to correspond to the opening of the bank layer 270.

Accordingly, the touch electrode 320 can be disposed along the bank layer 270 to correspond to the bank layer 270. When the touch electrode 320 is disposed to correspond to the bank layer 270 as described above, the opening of the touch electrode 320 can also be disposed to correspond to the light emitting area (EA), thereby making it possible to minimize deterioration of light output efficiency, which is caused by an overlap of the touch electrode 320 and the light emitting area (EA).

A touch pad (PAD) can be disposed in the non-display area (NDA), and a touch routing wire 330, which is disposed to electrically connect the touch pad (PAD) and the touch electrode 320, can be formed on the insulation layer 313.

In this case, the touch pad (PAD) can be made of the same material as the gate electrode 212 and can be disposed in the same layer as the gate electrode 212, and the touch routing wire 330 can be made of the same material as the touch electrode 320 and can be disposed in the same layer as the touch electrode 320.

A plurality of convexly shaped lens layers 340 can be formed on the insulation layer 313. In this case, the lens layer 340 can be disposed inside the touch electrode 320.

The touch electrode 320, which has a mesh shape as illustrated in FIG. 6, can have an opening therein. In this case, each of the light emitting elements 260 can be disposed to correspond to the opening of the touch electrode 320.

The lens layer 340 can be disposed to correspond to the light emitting area (EA) of the light emitting element 260. Specifically, the light emitting area (EA) of the light emitting element 260 can be disposed to correspond to one or more lens layers 340. In FIG. 6, a single lens layer 340 corresponds to the light emitting area (EA) of a single light emitting element 260 but is not limited to this example. A plurality of lens layers 340 can correspond to the light emitting area (EA) of a single light emitting element 260.

According to the present disclosure, the lens layer 340 corresponding to the light emitting area (EA) of the light emitting element 260 can be disposed over the encapsulation layer 280 having a predetermined thickness such that the light emitting element 260 is spaced a predetermined distance apart from the lens layer 340. When the light emitting element 260 is spaced a predetermined distance apart from the lens layer 340, a focal length of a lens for improving efficiency of concentrating and outputting light emitted from the light emitting element 260 can be ensured, thereby improving luminance efficiency.

The lens layer 340 can be disposed not to overlap the touch electrode 320. Light rays at a predetermined angle or greater among light rays output from the light emitting element 260 can be totally reflected. The totally reflected light rays can be re-reflected inwards and can vanish instead of being output outwards.

As the light rays at an angle or greater, at which total reflection occurs, may not substantially contribute to light output, an area, where the light rays at an angle or greater at which total reflection occurs travels, can be a dead zone (Dead Zone). When the mesh-shaped touch electrode 320 corresponds to the dead zone, the touch electrode 320 may not interfered with emitting light rays with the help of the pattern.

The lens layer 340 can be disposed to overlay the light emitting area (EA) of the light emitting element 260. In case a size of the lens layer 340 is smaller than that of the light emitting area (EA), light rays passing through the lens layer 340 can be reduced, thereby causing lower light concentration efficiency and light output efficiency of the lens layer 340.

In case the size of the lens layer 340 is larger than that of the light emitting area (EA), a radius of curvature of the lens layer 340 becomes large, thereby causing lower power of a lens and lower light concentration efficiency.

Preferably, the lens layer 340 has a size large enough to maximize efficiency of concentrating light that is output from the light emitting area (EA) and passes through the lens layer 340, while having a radius of curvature small enough to increase power. For example, the lens layer 340 can be disposed not to overlap the above-described dead zone and not to overlap the touch electrode 320, thereby maximizing power and light concentration efficiency.

The lens layer 340 can be made of a low-temperature photo acryl (PAC) material that can be formed in the low temperature process at 100 degrees Celsius or lower, but not be limited. For example, the lens layer 340 can comprise Polytriazine or a material where one or more of titanium dioxide ($TiO_2$), zirconium dioxide ($ZrO_2$) and a nano filler is added to Polytriazine.

According to the present disclosure, the lens layer 340 can be convexly formed through the exposure process.

The light emitting element 260 is disposed below the lens layer 340. In case a process of forming the lens layer 340 is carried out at high temperature, the light emitting element 260 below the lens layer 340 can be damaged due to high temperature. When the lens layer 340 according to the present disclosure comprises a material, which can be formed at a temperature of 100 degrees Celsius or lower, and is formed through a low temperature process, damage done to the light emitting element 260 in the process of forming the lens layer 340 can be minimized.

In the related art, in case a planarizing layer is formed on the touch electrode 320, a patterning process is carried out using an exposure process to form the planarizing layer.

Unlike a display device of the related art, the display device according to the present disclosure can be additionally provided with the lens layer 340. The exposure process used in a planarizing layer patterning process of the related art can be carried out to form a convex shape of the lens layer 340 without an additional mask process. Accordingly, an additional mask process is not required for forming the lens layer 340.

Thus, unlike the display device of the related art, the display device according to the present disclosure may not require an additional mask process in order for the lens layer 340 to be formed, thereby causing no deterioration of efficiency of processing and ensuring improved luminance efficiency.

The process of forming the lens layer 340 is described as follows. A lens film can be coated on the encapsulation layer 280 to cover the insulation layer 313. In this case, the lens film can comprise Polytriazine or a material where one or more of titanium dioxide ($TiO_2$), zirconium dioxide ($ZrO_2$) and a nano filler is added to Polytriazine such that the low temperature process is carried out as described above.

After the coating of the lens film, an edge bead removal (EBR) process for removing an edge is carried out, a pre-bake process for removing a solvent from the lens film is carried out, and an exposure process, in which a pattern of a mask is exposed to the lens film and the lens film exposed to light experiences a light reaction, is carried out.

Additionally, a develop process and a rinse process are carried out and then a post-exposure process and a cure process and the like are carried out to form the lens layer 340.

A lens protecting layer 350 can be disposed on the lens layer 340 to cover the lens layer 340. In the case, a refractive index of the lens protecting layer 350 can be configured to be lower than a refractive index of the lens layer 340. Accordingly, light concentration efficiency and light output efficiency can be further increased on an interface of the lens layer 340 by a difference between the refractive indices.

For example, the lens layer 340 can have a refractive index of 1.5 to 1.8, and the lens protecting layer 350 can have refractive index of 1.3 to 1.55. In this case, preferably, the refractive index of the lens protecting layer 350 can be configured to be lower than the refractive index of the lens layer 340 and a difference between the refractive indices can be configured to be as large as possible.

The lens protecting layer 350 can comprise a material in which a hydroxyl group (—OH group) or a fluorine group (—F group) is added to a substituent of an epoxy resin or an acryl resin, or a material in which a nano-sized hollow silica is added to an epoxy resin or an acryl resin. For example, a specific group is added to a substituent, or a substituent comprises an additional material such that the lens protecting layer 350 has a lower refractive index than an organic encapsulation film 282 of the encapsulation layer 280 including an epoxy resin or an acryl resin.

Thus, the refractive index of the organic encapsulation film 282 can be lower than the refractive index of the lens layer 340, and the refractive index of the lens protecting layer 350 can be lower than the refractive index of the organic encapsulation film 282.

The lens protecting layer 350 can be made of a material having high flowability like the organic encapsulation film 282. Accordingly, the lens protecting layer 350 can be formed according to an ink jet printing method. For example, the lens protecting layer 350 can be formed according to the ink jet printing method and then a UV curing process is carried out and a post bake process is carried out.

Accordingly, to prevent the highly flowable lens protecting layer 350 from flowing, a closed curve-shaped second dam (DAM2) configured to surround the lens protecting layer 350 can be formed. For example, the second dam (DAM2) can be configured to surround an outer edge of the display area (DA) and can block a flow of the lens protecting layer 350.

Thus, the second dam (DAM2) can be disposed between the display area (DA) and the pad area and can block the flow of the lens protecting layer 350 such that the lens protecting layer 350 does not invade the pad area. As a result, the second dam (DAM2) can prevent the lens protecting layer 350 from being exposed outside the display device or from invading the pad area.

The second dam (DAM2) can be formed into a single dam. However, the second dam (DAM2) can be formed into a plurality of second dams (DAM2) to block the flow of the lens protecting layer 350 more effectively. According to the present disclosure, in FIG. 5, two second dams (DAM2) are formed but are not limited to this example.

Specifically, the second dam (DAM2) can be formed in the non-display area (NDA) to surround the lens protecting layer 350, and can be formed on the touch routing wire 330. Accordingly, the touch routing wire 330 can be formed between the first dam (DAM1) and the second dam (DAM2). In this case, a plurality of the first dams (DAM1) and the second dams (DAM2) can be alternately disposed as in FIG. 3 but are not limited to this example. The first dam (DAM1) and the second dam (DAM2) can be disposed to overlap. Additionally, the second dam (DAM2) can be disposed between the first dam (DAM1) and the display area (DA), or the first dam (DAM1) can be disposed between the second dam (DAM2) and the display area (DA).

A polarizing layer 400 can be disposed on the lens protecting layer 350.

Figure 7:
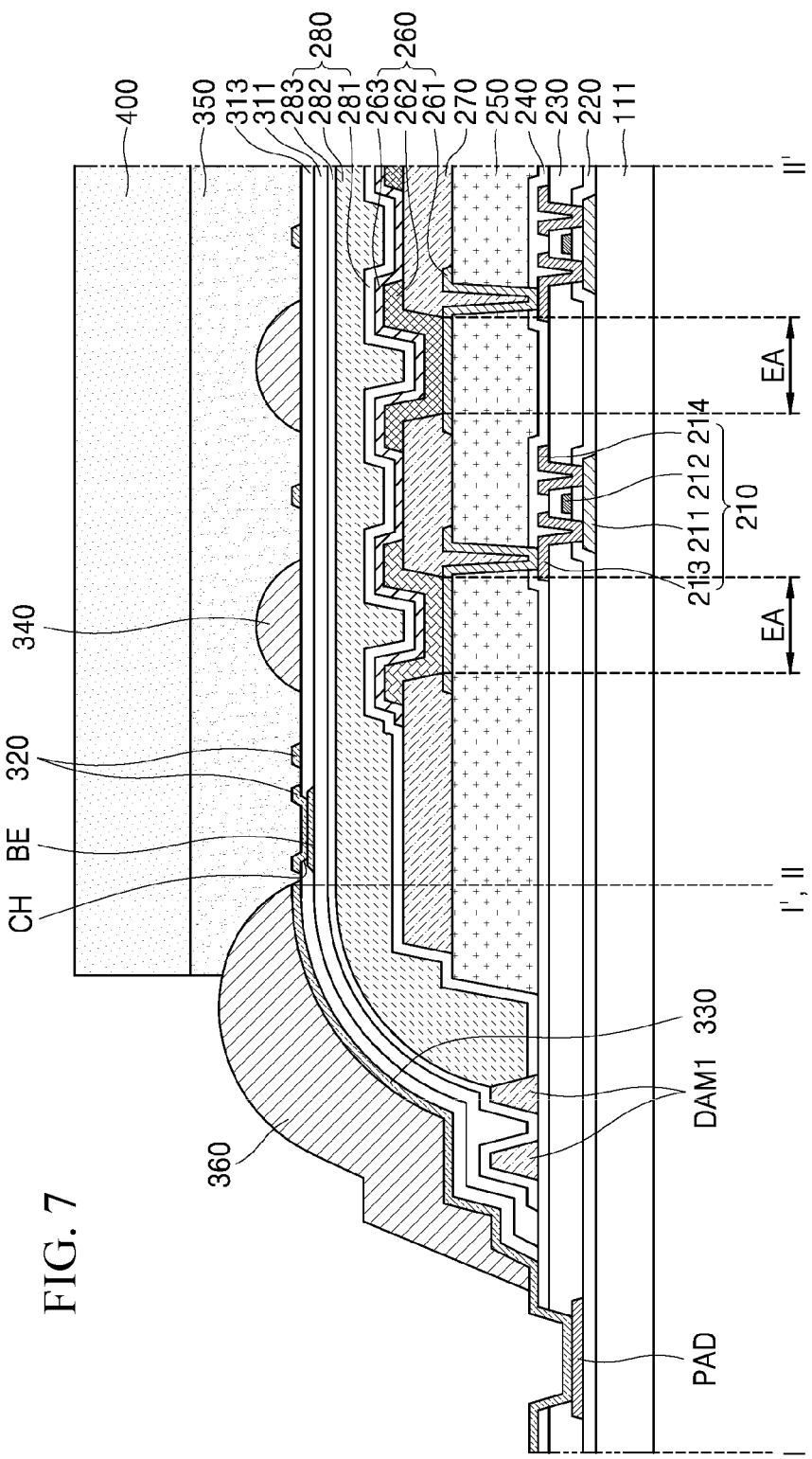
FIG. 7 is a is a cross-sectional view illustrating another example of section I-I' and section II-II' in FIG. 4.

FIG. 7 is a view illustrating a touch display device according to an aspect of another embodiment. Below, provided is description of the differences between the touch display device according to an aspect of another embodiment and the touch display device according to an aspect of the embodiment that is described with reference to FIG. 5. The details, described with reference to FIG. 5 and omitted from the following description, can also be applied to the touch display device according to an aspect of another embodiment.

As illustrated in FIG. 7, a capping layer 360 can be disposed over an insulation layer 313 while covering a touch routing wire 330, and an area of the capping layer 360, which correspond to a touch pad (PAD), can be opened.

The capping layer 360 can be made of the same material as a lens layer 340 and can be formed through the same process as the lens layer 340. For example, the capping layer 360 can be formed using the same exposure process for forming the lens layer 340 in the patterning process where the lens layer 340 is formed.

Additionally, a lens protection layer 350 can be formed on the insulation layer 313 to cover the lens layer 340 and a touch electrode 320. A polarizing layer 400 can be formed on the lens protection layer 350.

The lens protecting layer 350 can partially overlap the capping layer 360. In the area where the lens protecting layer 340 and the capping layer 360 overlap, the lens protecting layer 350 can be formed on the capping layer 360 to overlap the capping layer 360.

Specifically, in the area where the lens protecting layer 340 and the capping layer 360 overlap, the capping layer 360 can be formed to have a curved inclination. With the configuration, the capping layer 360 can serve as a dam that prevents the lens protecting layer 350 comprising highly flowable material from flowing. Accordingly, an additional dam is not required.

Further, the capping layer 360 can be formed to cover and protect the touch routing wire 330. Accordingly, scribe damage that might occur when a display panel is scribed from mother glass, and damage caused by foreign substances to the touch routing wire 330 during transportation can be minimized.

An area (PA) corresponding to the touch pad (PAD) may not be covered by the capping layer 360 but can be opened for an electric connection with another connection electrode.

Figure 8:
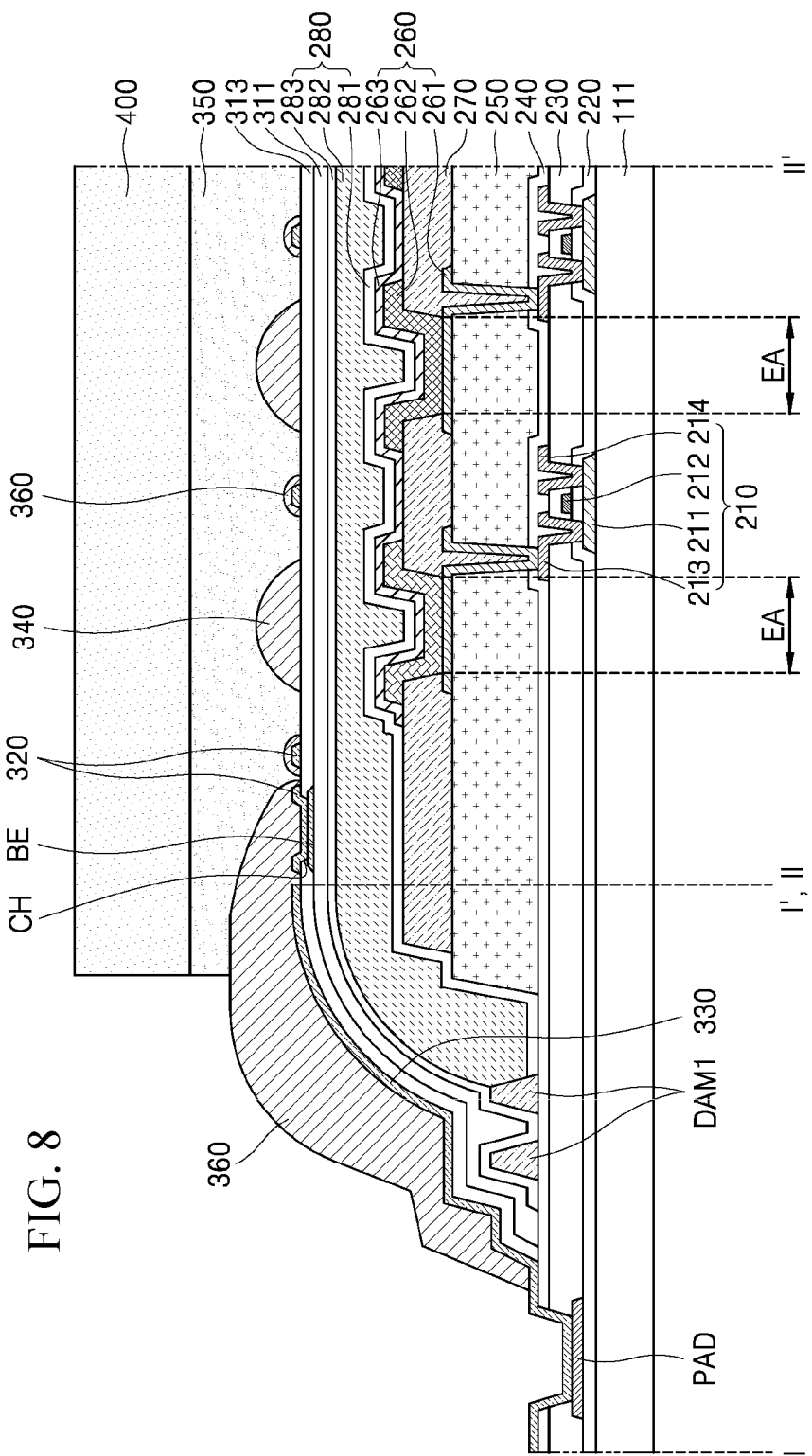
FIG. 8 is a is a cross-sectional view illustrating yet another example of section I-I' and section II-II' in FIG. 4.

FIG. 8 is a view illustrating a touch display device according to an aspect of yet another embodiment. Below, provided is description of the differences between the touch display device according to an aspect of yet another embodiment and the touch display device according to an aspect of the embodiment that is described with reference to FIG. 5. The details, described with reference to FIG. 5 and omitted from the following description, can also be applied to the touch display device according to an aspect of yet another embodiment.

As illustrated in FIG. 8, one or more capping layers 360 can be disposed over an insulation layer 313 while covering a touch routing wire 330 and a touch electrode 320, and an area of the capping layer 360, which correspond to a touch pad (PAD), can be opened.

The capping layer 360 can be made of the same material as a lens layer 340 and can be formed through the same process as the lens layer 340. For example, the capping layer 360 can be formed using the same exposure process for forming the lens layer 340 in the patterning process where the lens layer 340 is formed.

Additionally, an adhesive layer 370 can be formed on the insulation layer 313 to cover the lens layer 340, the touch electrode 320 and the capping layer 360. In this case, the adhesive layer 370 can be a pressure sensitive adhesive (PSA) but is not limited to this example. A polarizing layer 400 can be formed on the adhesive layer 370.

When a refractive index of the adhesive layer 370 is lower than a refractive index of the lens layer 340, light output efficiency and light concentration efficiency can further increase on the interface between the lens layer 340 and the adhesive layer 370. For example, the adhesive layer 370 and the polarizing layer 400 can be formed over the encapsulation layer 280 in a way that a polarizing layer 400 with the adhesive layer 370 attached to one surface thereof is laminated on the lens layer 340.

The adhesive layer 370 can partially overlap the capping layer 360 configured to cover the touch routing wire 330. In the area where the lens protecting layer 350 and the capping layer 360 overlap, the adhesive layer 370 can be formed on the capping layer 360 to overlap the capping layer 360.

In this case, the capping layer 360 can be formed to cover and protect the touch routing wire 330 and the touch electrode 320. Accordingly, scribe damage that might occur when a display panel is scribed from mother glass, and damage caused by foreign substances to the touch routing wire 330 during transportation can be minimized.

In an embodiment of FIG. 8, when a display panel is moved after being scribed, the display panel is moved before the polarizing layer 400, to which the adhesive layer 370 is attached, is laminated on the display panel. Accordingly, in case the capping layer 360 is configured not to cover the touch routing wire 330 and the touch electrode 320, the touch routing wire 330 and the touch electrode 320 can be exposed outwards, and can be damaged.

In case the capping layer 360 is configured to cover the touch routing wire 330 and the touch electrode 320 as in the embodiment of FIG. 8, the capping layer 360 can effectively protect the touch routing wire 330 and the touch electrode 320 until the polarizing layer 400, to which the adhesive layer 370 is attached, is laminated on the display panel.

As the capping layer 360, configured to cover the touch routing wire 330, is exposed outwards in an area where the capping layer 360 and the adhesive layer 370 do not overlap, the capping layer 360 can be relatively thick. However, preferably, the capping layer 360, configured to overlap the adhesive layer 370 and to cover the touch electrode 320, can be thick enough to protect the touch electrode 320.

An area (PA) corresponding to the touch pad (PAD) can be opened not to be overlaid with the capping layer 360 for an electric connection with another connection electrode.

Figure 9A:
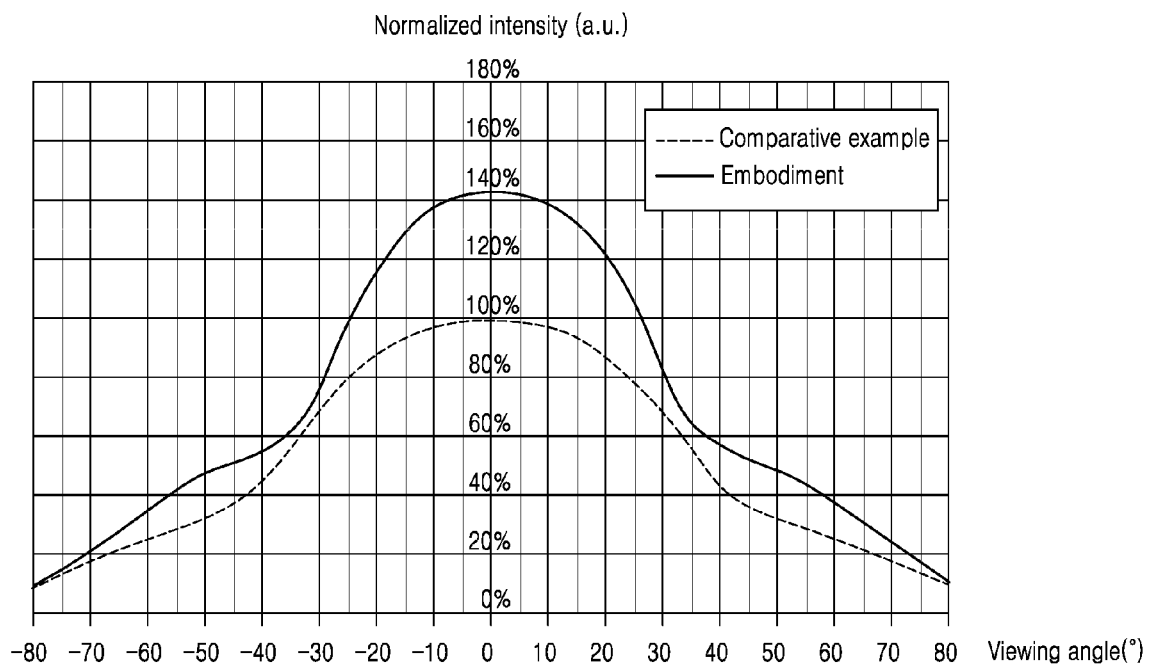
FIGS. 9A and 9B show results of measurement of normalized intensity of light on the basis of viewing angels in relation to a comparative example and an embodiment.
Figure 9B:
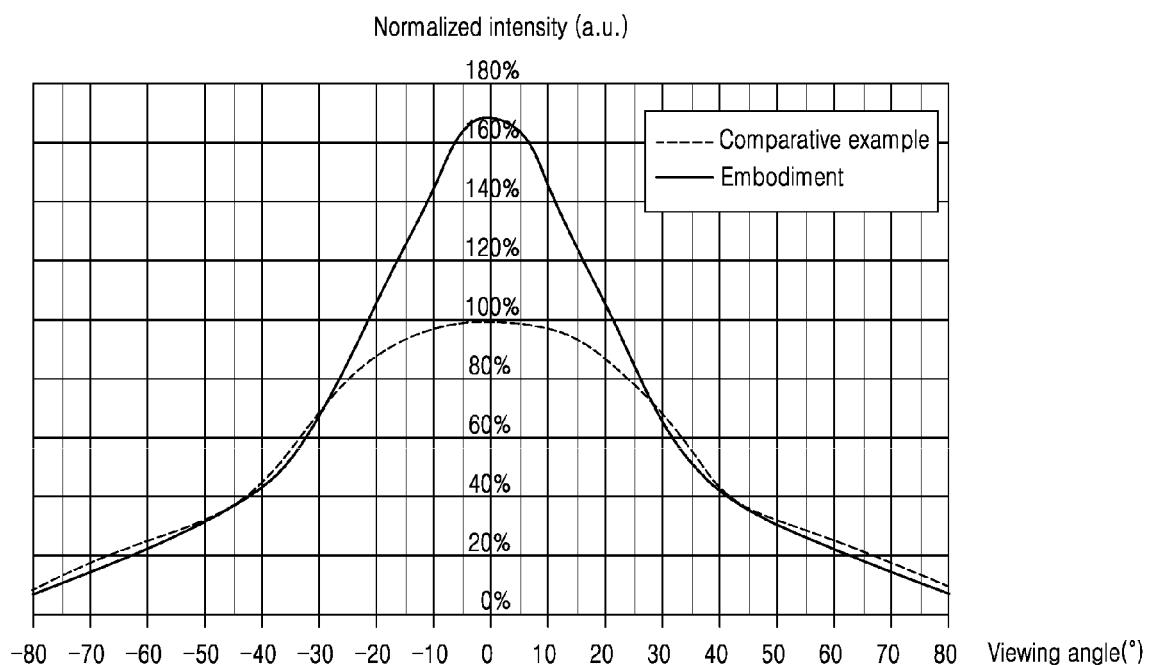

FIGS. 9A and 9B show results of measurement of normalized intensity of light on the basis of viewing angels in relation to a comparative example and an embodiment.

Measured were normalized intensity of a comparative example not provided with an additional lens layer according to the present disclosure, and normalize intensity of an embodiment provided with an additional lens layer according to the present disclosure as in FIG. 5.

FIG. 9A shows results of measurement of light extraction efficiency. The embodiment had improved light extraction efficiency at almost all viewing angles unlike the comparative example.

FIG. 9B shows results of measurement of light output efficiency. In the embodiment, intensity of light was significantly improved at a central portion. Accordingly, an increase in front luminance resulted in an increase in light output efficiency.

Light extraction efficiency of the embodiment provided with an additional lens layer according to the present disclosure was improved at almost all viewing angles unlike the comparative example.

According to an aspect of an embodiment, a touch display device can comprise a base substrate comprising a display area and a non-display area, a plurality of light emitting elements disposed in the display area, an encapsulation layer disposed to cover the plurality of light emitting elements, a plurality of touch electrodes having a mesh shape and disposed on the encapsulation layer, and a plurality of lens layers having a convex shape and disposed inside a touch electrode while being disposed on the encapsulation layer.

In this case, the touch display device can further comprise a bank layer disposed below the encapsulation layer and having a plurality of openings, and the touch electrode can be disposed to correspond to the bank layer.

A light emitting area of the light emitting element can correspond to one or more lens layers.

The touch display device can further comprise a lens protecting layer disposed to cover the lens layer, a polarizing layer can be disposed on the lens protecting layer, and a refractive index of the lens protecting layer can be lower than a refractive index of the lens layer.

In this case, the lens layer can comprise polytriazine or a material where one or more of titanium dioxide ($TiO_2$), Zirconium dioxide ($ZrO_2$) and a nano filler is added to polytriazine, and the lens protecting layer comprises a material in which a hydroxyl group (—OH group) or a fluorine group (—F group) is added to a substituent of an epoxy resin or an acryl resin, or a material in which a nano-sized hollow silica is added to an epoxy resin or an acryl resin.

The encapsulation layer can comprise at least one organic encapsulation film, and a first dam disposed in the non-display area and configured to surround the organic encapsulation film. The organic encapsulation film can comprise an epoxy resin or an acryl resin.

A refractive index of the organic encapsulation film can be lower than a refractive index of the lens layer, and a refractive index of the lens protecting layer can be lower than a refractive index of the organic encapsulation film.

The touch display device can further comprise a second dam disposed in the non-display area and configured to surround the lens protecting layer.

In this case, a touch routing wire can be disposed over the encapsulation layer along the encapsulation layer to electrically connect a touch pad and a touch electrode, and the touch routing wire can be disposed between the first dam and the second dam.

According to an aspect of another embodiment, a touch display device can comprise a touch routing wire that is disposed over an encapsulation layer along the encapsulation layer to electrically connect a touch pad and a touch electrode, and a capping layer that is configured to cover the touch routing wire and that is disposed such that an area of the capping layer corresponding to the touch pad is opened.

In this case, the capping layer can overlap at least partially the lens protecting layer, and the capping layer can be made of the same material as the lens layer.

According to an aspect of yet another embodiment, a touch display device can further comprise an adhesive layer disposed to cover a lens layer, a polarizing layer can be disposed on the adhesive layer, and a refractive index of the adhesive layer can be lower than a refractive index of the lens layer.

In this case, a touch pad can be disposed in a non-display area, a touch routing wire can be disposed over an encapsulation layer along the encapsulation layer to electrically connect a touch pad and a touch electrode, and the touch display device can comprise a capping layer that is configured to cover the touch routing wire and the touch electrode and that is disposed such that an area of the capping layer corresponding to the touch pad is opened.

The capping layer can be disposed between the adhesive layer and the encapsulation layer, and the capping layer can be made of the same material as the lens layer.

The present disclosure has been provided with reference to the embodiments illustrated in the drawings. However, the disclosure is not limited to the embodiments and the drawings set forth herein. Further, various modifications can be made by one having ordinary skill in the art within the scope of the technical spirit of the disclosure. Further, though not explicitly described during description of the embodiments of the disclosure, effects and predictable effects based on the configuration in the disclosure should be included in the scope of the disclosure.

What is claimed is:

1. A touch display device, comprising:
   a base substrate comprising a display area and a non-display area;
   a plurality of light emitting diodes disposed in the display area;
   an encapsulation layer disposed to cover the plurality of light emitting diodes; and
   a touch sensing layer comprising a plurality of touch electrodes and a plurality of lens layers, disposed on the encapsulation layer,
   wherein the plurality of touch electrodes have a mesh shape, and the plurality of lens layers have a convex shape and are disposed inside one touch electrode of the plurality of touch electrodes.

2. The touch display device of claim 1, wherein the touch display device further comprises a bank layer disposed below the encapsulation layer and having a plurality of openings, and
   the one touch electrode is disposed to correspond to the bank layer.

3. The touch display device of claim 1, wherein a light emitting area of each of the plurality of light emitting diodes corresponds to one or more of the plurality of lens layers.

4. The touch display device of claim 1, wherein the touch display device further comprises a lens protecting layer disposed to cover one lens layer of the plurality of lens layers.

5. The touch display device of claim 4, wherein a polarizing layer is disposed on the lens protecting layer.

6. The touch display device of claim 4, wherein a refractive index of the lens protecting layer is lower than a refractive index of the one lens layer.

7. The touch display device of claim 6, wherein the one lens layer comprises polytriazine or a material where one or more of titanium dioxide ($TiO_2$), Zirconium dioxide ($ZrO_2$) and a nano filler are added to polytriazine.

8. The touch display device of claim 6, wherein the lens protecting layer comprises a material in which a hydroxyl group (—OH group) or a fluorine group (—F group) is added to a substituent of an epoxy resin or an acryl resin, or a material in which a nano-sized hollow silica is added to an epoxy resin or an acryl resin.

9. The touch display device of claim 4, wherein the encapsulation layer comprises at least one organic encapsulation film, and a first dam disposed in the non-display area and configured to surround the least one organic encapsulation film.

10. The touch display device of claim 9, wherein the least one organic encapsulation film comprises an epoxy resin or an acryl resin.

11. The touch display device of claim 9, wherein a refractive index of the least one organic encapsulation film is lower than a refractive index of the one lens layer.

12. The touch display device of claim 9, wherein a refractive index of the lens protecting layer is lower than a refractive index of the least one organic encapsulation film.

13. The touch display device of claim 9, wherein the touch display device further comprises a second dam disposed in the non-display area and configured to surround the lens protecting layer.

14. The touch display device of claim 13, wherein a touch pad is disposed in the non-display area,
a touch routing wire is disposed over the encapsulation layer along the encapsulation layer to electrically connect the touch pad and the one touch electrode, and
the touch routing wire is disposed between the first dam and the second dam.

15. The touch display device of claim 9, wherein a touch pad is disposed in the non-display area,
a touch routing wire is disposed over the encapsulation layer along the encapsulation layer to electrically connect the touch pad and the one touch electrode, and
the touch display device comprises a capping layer that is configured to cover the touch routing wire and that is disposed so that an area of the capping layer corresponding to the touch pad is opened.

16. The touch display device of claim 15, wherein the capping layer overlaps at least partially the lens protecting layer, and
the capping layer is made of a same material as the one lens layer.

17. The touch display device of claim 1, wherein the touch display device further comprises an adhesive layer disposed to cover one lens layer of the plurality of lens layers.

18. The touch display device of claim 17, wherein a polarizing layer is disposed on the adhesive layer.

19. The touch display device of claim 17, wherein a refractive index of the adhesive layer is lower than a refractive index of the one lens layer.

20. The touch display device of claim 17, wherein a touch pad is disposed in the non-display area,
a touch routing wire is disposed over the encapsulation layer along the encapsulation layer to electrically connect the touch pad and the one touch electrode, and
the touch display device comprises a capping layer that is configured to cover the touch routing wire and the one touch electrode and that is disposed so that an area of the capping layer corresponding to the touch pad is opened.

21. The touch display device of claim 20, wherein the capping layer is disposed between the adhesive layer and the encapsulation layer, and
the capping layer is made of a same material as the one lens layer.

* * * * *